(12) United States Patent
Komuta

(10) Patent No.: US 10,090,273 B2
(45) Date of Patent: Oct. 2, 2018

(54) APPARATUS AND METHOD FOR MANUFACTURING SEMICONDUCTOR DEVICE

(71) Applicant: Toshiba Memory Corporation, Tokyo (JP)

(72) Inventor: Naoyuki Komuta, Oita Oita (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 457 days.

(21) Appl. No.: 14/636,168

(22) Filed: Mar. 2, 2015

(65) Prior Publication Data
US 2016/0079200 A1 Mar. 17, 2016

(30) Foreign Application Priority Data
Sep. 16, 2014 (JP) .................................. 2014-187678

(51) Int. Cl.
| B23K 1/00 | (2006.01) |
| H01L 23/00 | (2006.01) |
| B23K 3/047 | (2006.01) |

(52) U.S. Cl.
CPC ............ *H01L 24/81* (2013.01); *B23K 1/0016* (2013.01); *B23K 3/0478* (2013.01); *H01L 24/75* (2013.01); *H01L 24/13* (2013.01); *H01L 2224/131* (2013.01); *H01L 2224/7592* (2013.01); *H01L 2224/75251* (2013.01); *H01L 2224/75252* (2013.01); *H01L 2224/75301* (2013.01); *H01L 2224/75502* (2013.01); *H01L 2224/75701* (2013.01); *H01L 2224/75702* (2013.01); *H01L 2224/75744* (2013.01); *H01L 2224/75745* (2013.01); *H01L 2224/75753* (2013.01); *H01L 2224/75802* (2013.01); *H01L 2224/75804* (2013.01); *H01L 2224/75822* (2013.01);
(Continued)

(58) Field of Classification Search
CPC B23K 2201/40; B23K 1/0016; B23K 20/023; B23K 2201/42; H05K 2203/082; H05K 2203/163; H05K 3/3494
USPC ..... 228/103, 127, 233.1, 234.1, 235.1, 46, 9
See application file for complete search history.

(56) References Cited

U.S. PATENT DOCUMENTS

| 7,075,036 B2 | 7/2006 | Ogimoto et al. |
| 2005/0098610 A1* | 5/2005 | Onobori ............... B23K 1/0016 228/180.21 |

(Continued)

FOREIGN PATENT DOCUMENTS

| JP | 2000252326 A | 9/2000 |
| JP | 2006-324702 A | 11/2006 |

(Continued)

OTHER PUBLICATIONS

Taiwan Office Action dated Apr. 13, 2016, filed in Taiwan counterpart Application No. 104106386, 9 pages (with translation).

*Primary Examiner* — Erin B Saad
(74) *Attorney, Agent, or Firm* — Patterson & Sheridan, LLP

(57) ABSTRACT

A manufacturing apparatus of a semiconductor device includes a stage, a head unit configured to face the stage, a driving unit configured to move the head unit towards and away from the stage, a heating unit configured to heat the head unit, and a control unit configured to control the driving unit to move the head unit away from the stage when the heating unit heats the head unit.

13 Claims, 8 Drawing Sheets

(52) U.S. Cl.
CPC ........... *H01L 2224/75824* (2013.01); *H01L 2224/75901* (2013.01); *H01L 2224/8115* (2013.01); *H01L 2224/8116* (2013.01); *H01L 2224/8117* (2013.01); *H01L 2224/8118* (2013.01); *H01L 2224/81048* (2013.01); *H01L 2224/81191* (2013.01); *H01L 2224/81192* (2013.01); *H01L 2224/81203* (2013.01); *H01L 2224/81815* (2013.01); *H01L 2224/81948* (2013.01); *H01L 2924/3841* (2013.01)

(56) References Cited

U.S. PATENT DOCUMENTS

2013/0153644 A1\* 6/2013 Hojo .................. H01L 24/16
228/102
2013/0181037 A1 7/2013 Nagai et al.

FOREIGN PATENT DOCUMENTS

| JP | 2009099744 A | 5/2009 |
| JP | 2011124411 A | 6/2011 |
| TW | 200605246 | 2/1996 |

\* cited by examiner

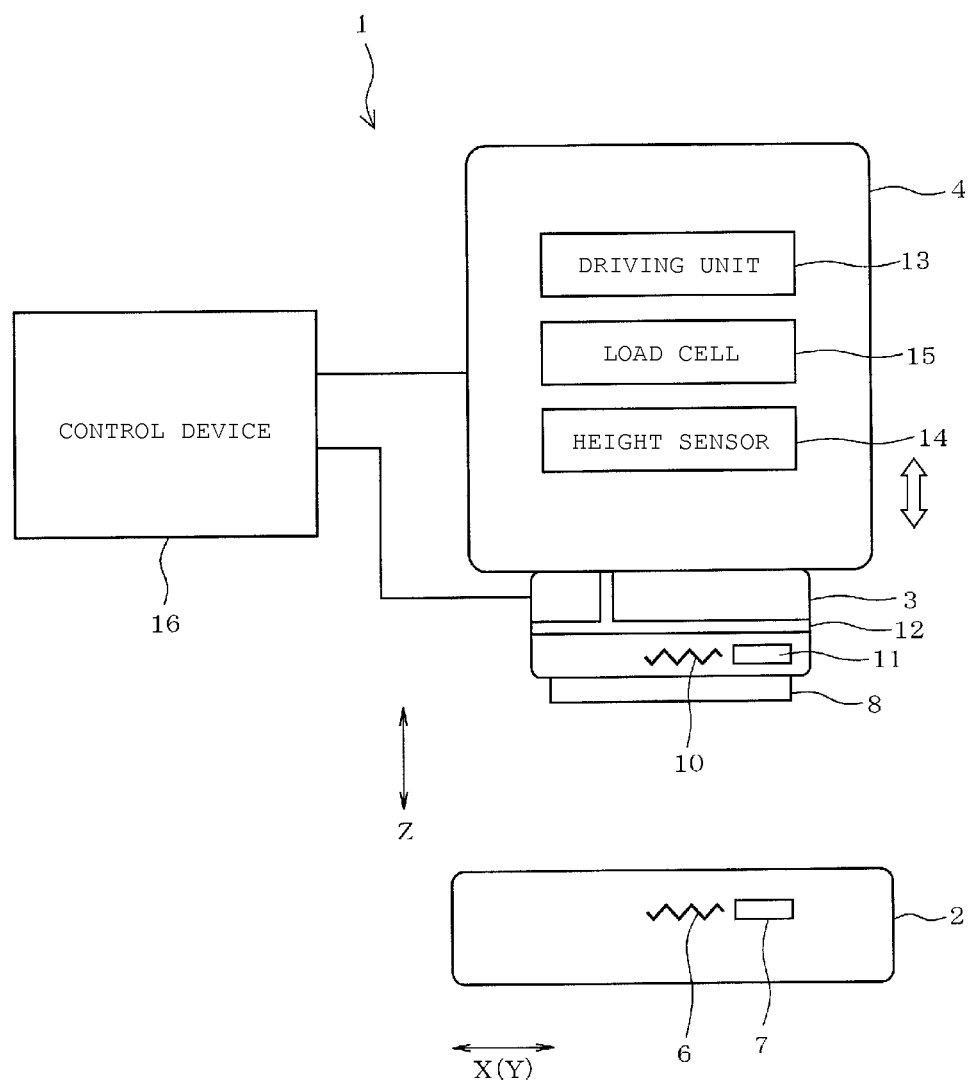

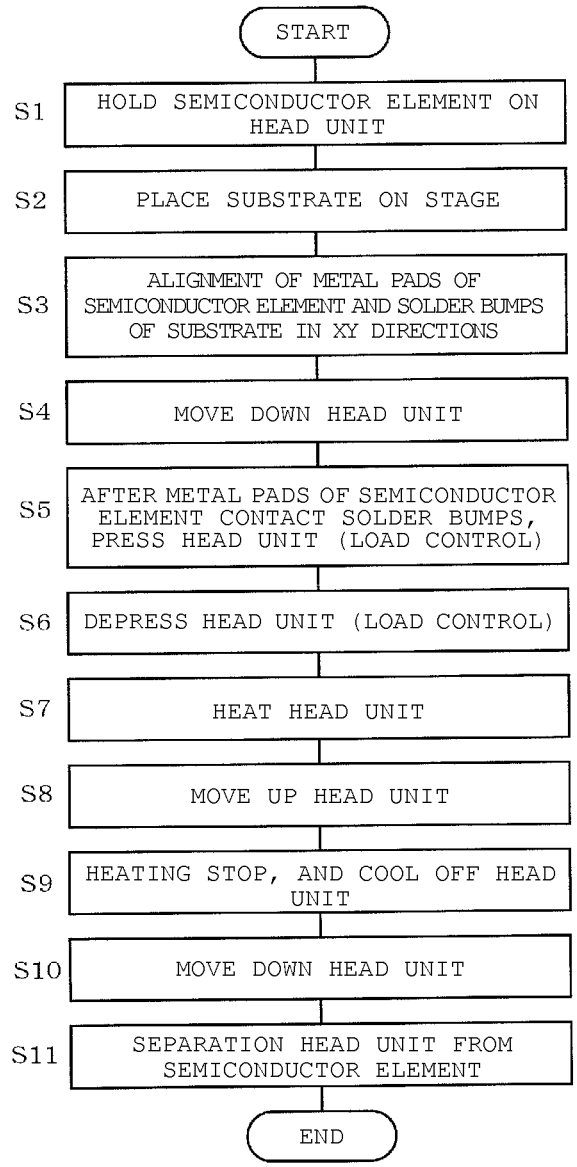

US 10,090,273 B2

APPARATUS AND METHOD FOR MANUFACTURING SEMICONDUCTOR DEVICE

CROSS-REFERENCE TO RELATED APPLICATION

This application is based upon and claims the benefit of priority from Japanese Patent Application No. 2014-187678, filed Sep. 16, 2014, the entire contents of which are incorporated herein by reference.

FIELD

Embodiments described herein relate generally to a manufacturing apparatus of a semiconductor device, and a manufacturing method of a semiconductor device.

BACKGROUND

A manufacturing apparatus of a semiconductor device connects metal electrode pads formed on a semiconductor element to metal bumps formed on a substrate.

One type of such a manufacturing apparatus includes a head unit and a stage, and the substrate having the metal bumps is mounted on the stage and the semiconductor device having the metal electrode pads is mounted on the head unit. Then, the stage is heated to a temperature at which the metal bumps are not melted, and the head unit is moved down such that the metal electrode pads contact the metal bumps. Then, the metal bumps are heated and melted.

Thereafter, by stopping the heating, the metal bumps are cooled off and solidified, and as a result the metal bumps are electrically connected to the metal electrode pads. Thereafter, the head unit is moved up and separated from the semiconductor device. As a result, it is possible to obtain a semiconductor device electrically connected to the substrate.

However, during the manufacturing process of the semiconductor device described above, the head unit and the stage may expand or contract depending on temperatures thereof, and a position of the semiconductor device relative to the substrate may change. When the metal electrode pads of the semiconductor device approach the substrate too closely, the adjacent metal bumps may be electrically connected (i.e., short-circuited) when melted.

DESCRIPTION OF THE DRAWINGS

FIG. 1 is a schematic diagram of a manufacturing apparatus of a semiconductor device according to an embodiment.

FIG. 2 is a flow chart of a manufacturing process according to an embodiment.

DETAILED DESCRIPTION

In general, according to one embodiment, a manufacturing apparatus of a semiconductor device includes a stage, a head unit configured to face the stage, a driving unit configured to move the head unit towards and away from the stage, a heating unit configured to heat the head unit, and a control unit configured to control the driving unit to move the head unit away from the stage when the heating unit heats the head unit.

Hereinafter, the embodiments will be described with reference to FIG. 1 to FIG. 11. Furthermore, the drawings are schematic diagrams, and a relationship between a thickness and a planar dimension, a ratio of the thicknesses of the layers, and the like do not necessarily match actual values. Moreover, a vertical direction and a horizontal direction, indicate the relative directions when a circuit formation face side of a semiconductor substrate (described below) is assumed to be an upper side or a lower side, and do not necessarily match a gravity acceleration direction.

FIG. 1 illustrates a schematic configuration of a manufacturing apparatus 1 of a semiconductor device. In FIG. 1, the manufacturing apparatus 1 is indicated as a group of different units which are separated from each other, but may be configured so that the whole units of the manufacturing apparatus 1 are integrated in a single housing (not illustrated). A stage 2, formed of ceramic or the like, is disposed on a lower side of the manufacturing apparatus 1. A head unit 3 and a support unit 4, which supports the head unit 3 to be movable up and down, are disposed above the stage 2. In the following description, the vertical direction is referred to as Z axis direction, and horizontal directions are referred to as XY axis directions.

Figure 3A:
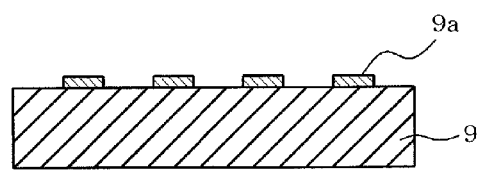
FIG. 3A, FIG. 3B, and FIG. 3C are cross-sectional views of a semiconductor element and a substrate before and after the process.
Figure 3B:
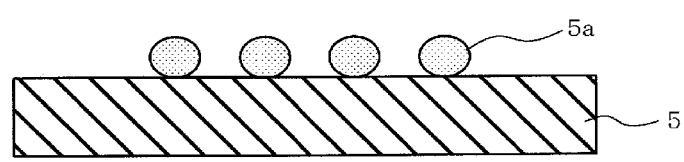

The stage 2 holds a substrate 5, which is to be used for a semiconductor device, such as a ceramic substrate or a glass epoxy substrate, on an upper face thereof, as illustrated in FIG. 3B. In the stage 2, a stage heater 6 for heating the substrate 5, which is placed on the upper face of the stage 2, at a predetermined temperature, is disposed therein, and a temperature sensor 7 for monitoring the temperature is also disposed. For example, the heating of the stage 2 by the stage heater 6 is controlled based on the temperature monitored by the temperature sensor 7, so as to heat a solder bump 5a, which is a metal bump formed on the substrate 5 illustrated in FIG. 2, at a constant temperature (for example, 150° C.), which is lower than a melting point of the solder bump 5a.

A bonding tool 8 is disposed on a lower surface portion of the head unit 3, and capable of sucking and holding a semiconductor element 9 such as the semiconductor chip, illustrated in FIG. 3A. In the head unit 3, a head heater 10 for heating the semiconductor element 9 which is held by the bonding tool 8, and a temperature sensor 11 for monitoring the temperature, are disposed. Moreover, in the head unit 3, a cooling hole 12 for circulating high-pressure air for cooling, is also disposed therein.

The head heater 10 may rapidly raise the temperature in accordance with generation of heat using a current flow, heats the head unit 3, and functions as a pulse heater. Hereby, the temperature of the semiconductor element 9 sucked and held by the bonding tool 8, may be rapidly raised. Additionally, in a case of stopping the heating, by blocking the current to the head heater 10 and circulating the high-pressure air into the cooling hole 12 for the cooling, the temperature of the head unit 3 may be rapidly lowered.

In the support unit 4, a driving unit 13 for moving the head unit 3 in the Z axis direction (vertical direction) is disposed, and a position sensor 14 for detecting the position of the head unit 3 is disposed. Hereby, it is possible to control the position of the head unit in the Z axis direction by monitoring a detection result of the position sensor 14. Moreover, in the support unit 4, a load cell (sensor for detecting a load) 15 that detects a load value applied to the stage 2 when the head unit 3 moves down and (indirectly) contacts the stage 2, is disposed. By monitoring the load value applied by the head unit 3 using the load cell 15, it is possible to control the position of the head unit 3 based on the detected load value.

A control device 16 includes a CPU, a memory, and the like, and controls the whole manufacturing apparatus 1 according to a program. According to the program (described below), the control device 16 controls the movement of respective units such as the stage 2, the head unit 3, and the support unit 4. Moreover, although not illustrated in the drawings, a position recognition camera is provided in the manufacturing apparatus 1. While the substrate 5 is placed on the stage 2 and the semiconductor element 9 is held on the bonding tool 8 of the head unit 3, the position recognition camera captures images of the substrate 5 and the semiconductor element 9 in the XY axis directions (horizontal direction). The control device 16, in order to locate the substrate 5 and the semiconductor element 9 in correct connection positions, controls the movement in the XY directions and a rotational direction within a horizontal plane, based on the captured images.

Next, a manufacturing process of a semiconductor device carried out by the manufacturing apparatus 1 will be described. FIG. 3A illustrates a schematic cross section of the semiconductor element 9 described above, which includes an integrated circuit built through various processes on a surface portion of the semiconductor substrate such as the silicon substrate. On the surface (upper face) of the semiconductor element 9, a plurality of metal pads 9a, which are metal electrodes for being electrically connected to an external unit, are formed.

FIG. 3B illustrates a schematic cross section of the substrate 5. For example, the substrate 5 is formed of ceramic, and on the surface (upper face) thereof, an electrode pattern to be electrically connected to the metal pad 9a of the semiconductor element 9, is formed. In the connection portions, the solder bumps 5a (metal bumps) are formed. Moreover, in the state where the semiconductor element 9 is mounted on the surface of the substrate 5 or a rear face of the substrate 5, various terminal portions to be connected to an external circuit, are disposed and formed. In this case, when the terminal portions are formed on the rear face, the substrate 5 is disposed so that a conduction body for the wiring is connected onto the rear face side through the inside of the substrate 5.

Figure 3C:
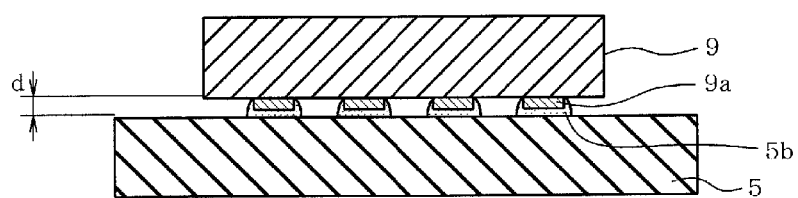

FIG. 3C illustrates a schematic cross section of a structure including the semiconductor element 9 mounted on the substrate 5 described above. The solder 5b of the substrate 5 are electrically connected to the metal pads 9a of the semiconductor element 9, after the solder bumps 5a are pressurized while the solder bumps 5a are melted, as illustrated in FIG. 3C. Here, the semiconductor element 9 is mounted on the substrate with a distance d between the semiconductor element 9 and the substrate 5. As the solder bumps 5a are not excessively pressed at the time of the installation, the adjacent solders 5b are not electrically connected to each other, so that a short-circuit may not be caused.

Next, a mounting process of the semiconductor element 9 to the substrate 5 according to the manufacturing apparatus 1, will be described with reference to FIG. 2, and FIG. 4 to FIG. 11.

Figure 9:
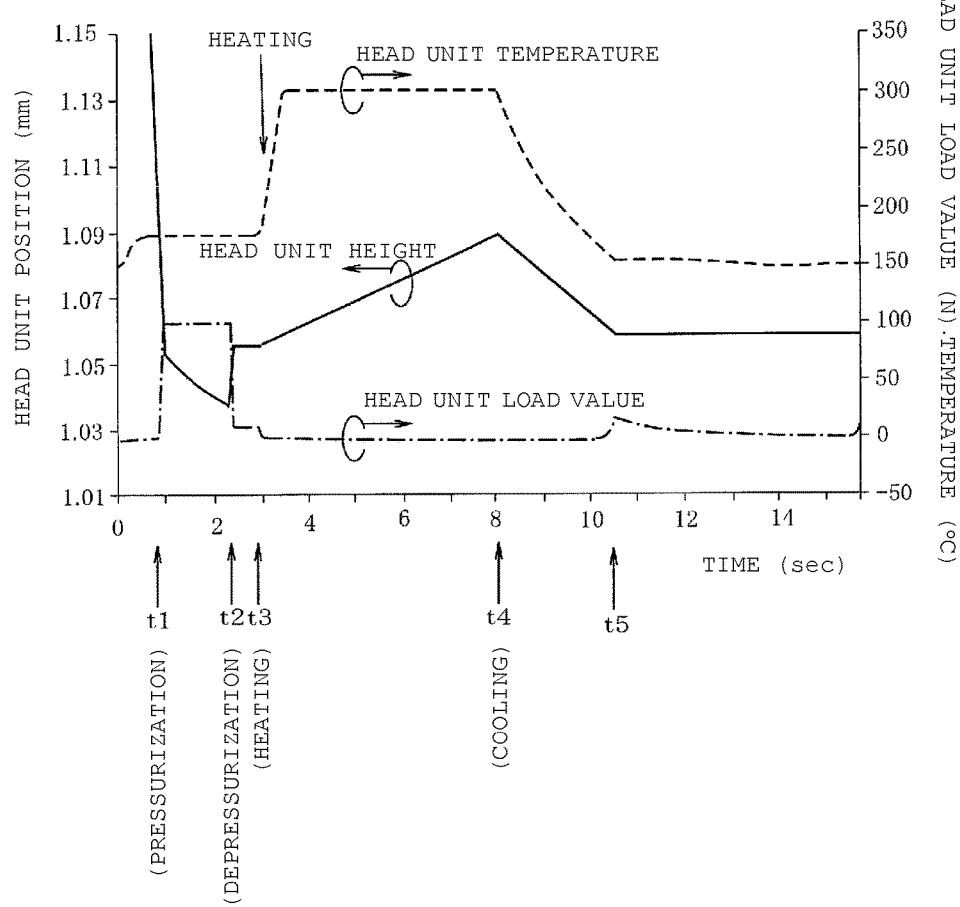
FIG. 9 illustrates a temperature, a position, and a stress of a head unit according to time.

FIG. 2 is a flowchart of the mounting process executed by the control device 16 of the manufacturing apparatus 1. Hereinafter, in accordance with the flowchart in FIG. 2, the process will be described. Moreover, FIG. 9 illustrates a transition of the temperature of the head unit 3 in accordance with the flow of the process, a transition of the load value applied by the head unit 3, and a transition of a height of the head unit 3.

Figure 4:
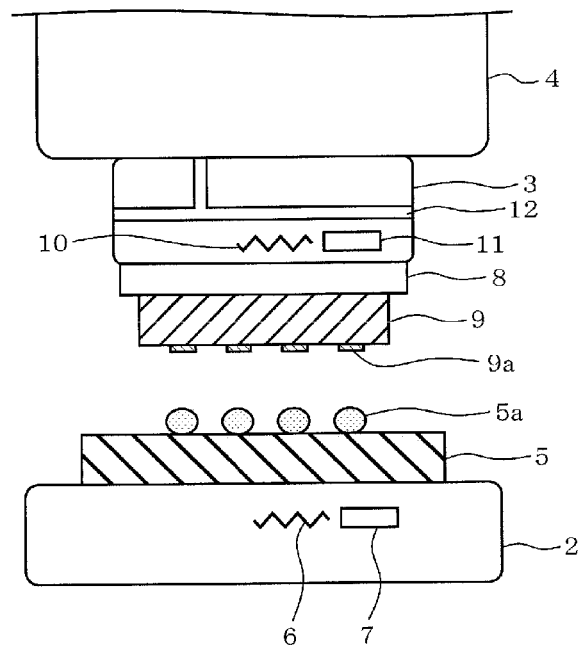
FIG. 4 is an enlarged cross-sectional view of the manufacturing apparatus during a step.

First, as illustrated in FIG. 4, at the start time, the head unit 3 of the manufacturing apparatus 1 is located at a position which is apart from the stage 2. In this position, the semiconductor element 9 is placed on the bonding tool 8 of the head unit 3, and according to the control by the control device 16, the semiconductor element 9 is held by the bonding tool 8 using a method such as suction (S1 in FIG. 2). Next, the substrate 5 is placed on the upper surface of the stage 2, and according to the control by the control device 16, the substrate 5 is held on the upper face of the stage 2 by sucking the substrate 5 (S2 in FIG. 2).

Next, according to the control by the control device 16, the position recognition camera is inserted and disposed in a space between the stage 2 and the head unit 3, and captures the images of the substrate 5 and the semiconductor element 9, which are positioned on the upper side and the lower side in the Z axis direction. Thereafter, by relatively moving the stage 2 or the head unit 3 in the XY axis directions (horizontal directions) and the rotational direction within the horizontal plane, the positions of the solder bumps 5a of the substrate 5 which is mounted on the stage 2, and the metal pads 9a of semiconductor element 9 which is mounted on the bonding tool 8 of the head unit 3, are aligned so as to face each other (S3 in FIG. 2).

Subsequently, according to the control by the control device 16, the head unit 3 is moved so as to be close to the stage 2 by lowering the head unit 3. At this time, when the position of the head unit 3 in the Z axis direction is adjusted based on a detection signal of the position sensor 14, the height of the head unit 3 shortly before the solder bumps 5a of the substrate 5 contact the metal pads 9a of the semiconductor element 9, is set in advance by the control device 16, and thereby, it is possible to rapidly adjust the position.

Figure 5:
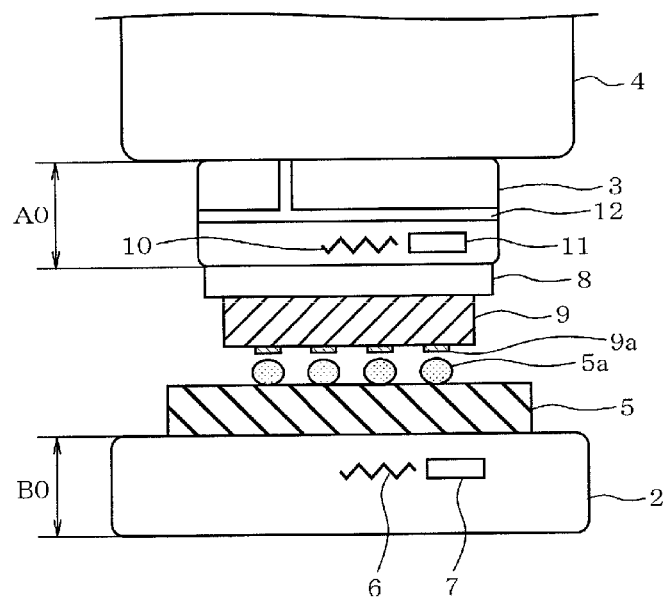
FIG. 5 is an enlarged cross-sectional view of the manufacturing apparatus during a step after the step in FIG. 4.

Hereby, as illustrated in FIG. 5, the head unit 3 is moved to the position where the head unit 3 is close to the stage 2. Thereafter, according to the control of the control device 16, the head unit 3 is further lowered while monitoring the detection signal of the load cell 15. The head unit 3 is lowered until the load, which is generated after the solder bumps 5a come into contact with the metal pads 9a (the head unit 3 lands on the stage 2), reaches a threshold value (S4 in FIG. 2).

Alternatively, the head unit 3 may be lowered while monitoring the detection signal of the load cell 15, without monitoring the position sensor 14. That is, according to the control by the control device 16, the head unit 3 is lowered in the Z axis direction at a constant speed while a detection load of the load cell 15 is monitored. When the metal pads 9a contact the solder bumps 5a, i.e., when the load value reaches the threshold value, the movement of the head unit 3 can be stopped.

After the solder bumps 5a and the metal pads 9a are in a contact state (state where the head unit 3 lands on the stage 2), lowering the head unit 3, the head unit 3 is further lowered while the control device monitors the load cell 15 until a pressurization value of the stage 2 by the head unit 3 reaches a specific value (S5 in FIG. 2, and time t1 in FIG. 9). At this time, the metal pads 9a of the semiconductor element 9 held by the head unit 3 are pressed against the solder bumps 5a of the substrate 5 placed on the stage 2, and the solder bumps 5a are deformed. In accordance with the deformation, a natural oxide film, which is formed on the surface of the solder bumps 5a that are in contact with the metal pads 9a, is torn, and an electrical conduction between the solder bumps 5a and the metal pads 9a may be obtained.

Figure 6A:
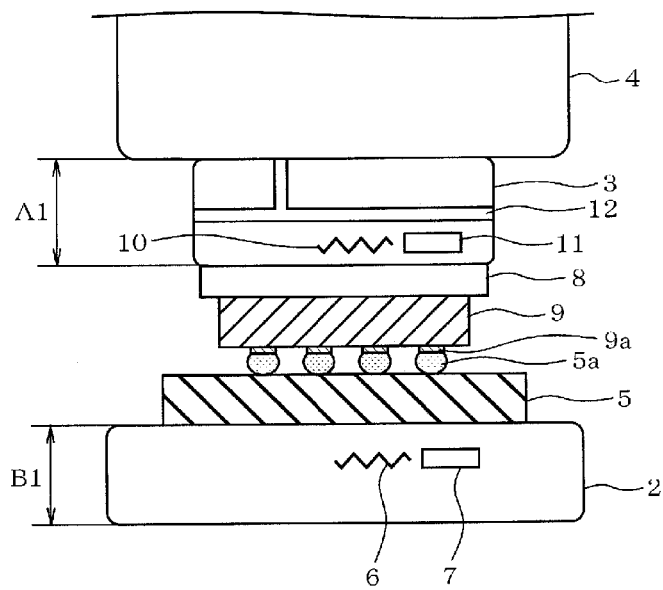
FIG. 6A and FIG. 6B are enlarged cross-sectional views of the manufacturing apparatus during steps after the step in FIG. 5.

Here, as illustrated in FIG. 5, a height of the head unit 3 in the state of not being pressurized is assumed to be A0, and a height of the stage 2 in the same state is assumed to be B0. As illustrated in FIG. 6A, when the solder bumps 5a are pressurized against the metal pads 9a, the height of the head unit 3 becomes A1 (<A0), which is smaller than A0, and the height of the stage 2 becomes B1 (<B0), which is smaller than B0.

As described above, when the pressurization operation is performed, the head unit 3 and the stage 2 become a compression state, and the heights become smaller (A1 and B1). When the heating operation is performed by the head heater 10 of the head unit 3 in this state, the solder bumps 5a of the substrate 5 are melted by being heated through the bonding tool 8 and the metal pads 9a of the semiconductor element 9.

Figure 6B:
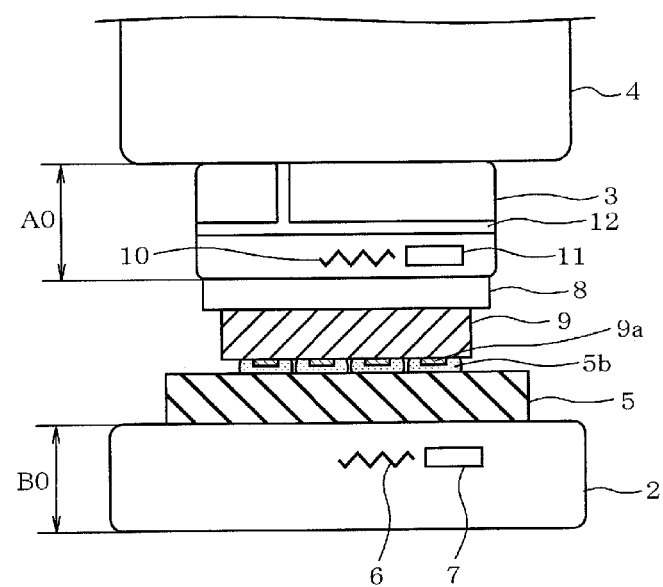
Figure 7:
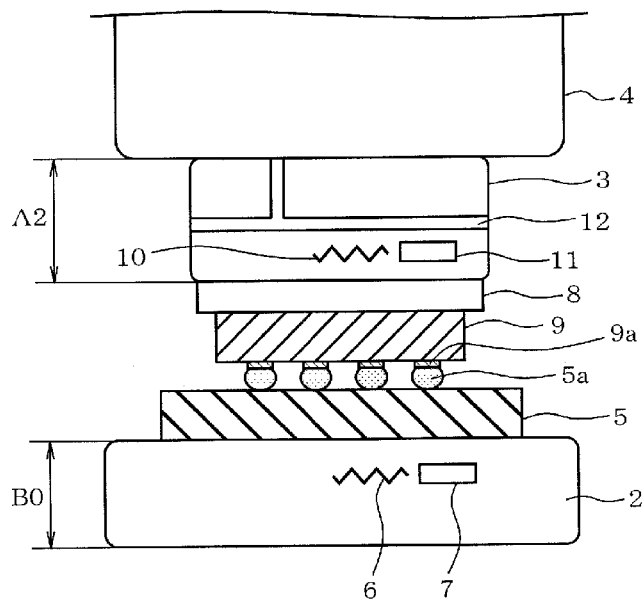
FIG. 7 is an enlarged cross-sectional view of the manufacturing apparatus during a step after the step in FIG. 6A.

As a result, the pressure to the head unit 3 and the stage 2 in the compression state is released, and the heights become the original heights A0 and B0. Furthermore, since the head unit 3 is expanded due to the heating, the height of the head unit further increases to A2, which is greater than the original height A0 (FIG. 7). At this time, by the expansion of the head unit 3 and the stage 2, as illustrated in FIG. 6B, the solder bumps 9a may be excessively crushed. As a result the adjacent solder bumps 9a may be in the contact state, and the electrical short-circuit may be caused.

To this problem, in the present embodiment, after the pressurization is performed, a depressurization is performed by the control device 16 so as to raise the head unit 3 (S6 in FIG. 2, and time t2 in FIG. 9). Specifically, the head unit 3 is raised (moved in the Z axis direction) while monitoring the detection signal of the load cell 15, and the raising of the head unit 3 is stopped in a state where the solder bump 5a and the metal pad 9a are in contact with each other (when the load detected by the load sensor cell 15 becomes a predetermined value).

Figure 10:
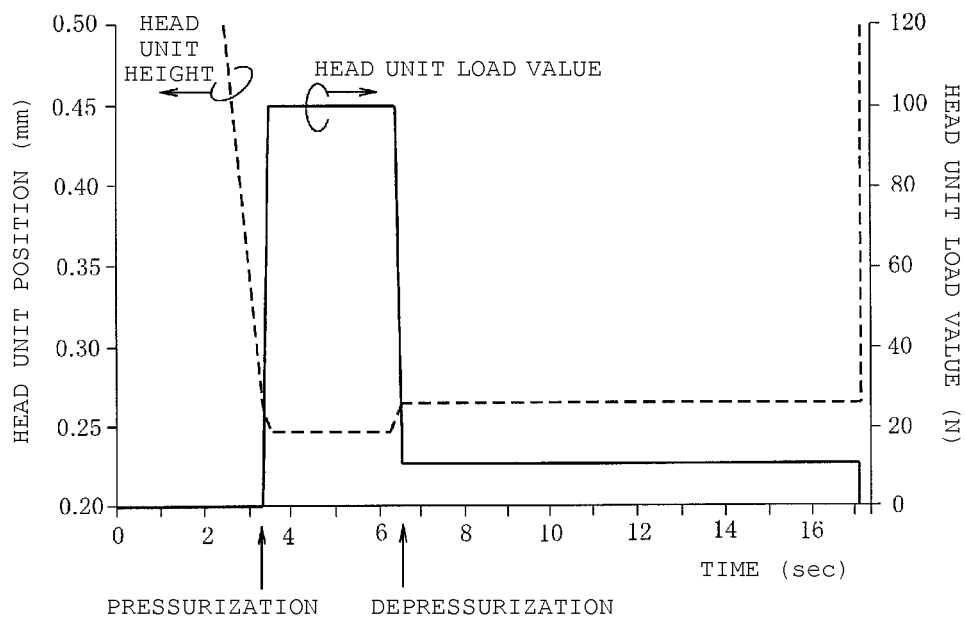
FIG. 10 illustrates the position and the stress of the head unit according to time.

Such a procedure is illustrated in FIG. 10. In FIG. 10, the position of the head unit 3 is indicated by a dashed line using the scale on the left side. Moreover, a detection load value (N) of the load cell 15 is indicated by a solid line using the scales on the right side. The time (sec) in FIG. 9 and the time (sec) in FIG. 10 do not match as the origins (0 sec) are not the same. FIG. 10 focuses on timing of the pressurization operation.

According to the procedure, when the operation is started, the head unit 3 is lowered in accordance with the control by the control device 16. Thereafter, when the metal pads 9a of the semiconductor element 9 held by the head unit 3 contact the solder bumps 5a of the substrate 5 placed on the stage 2, the detected load value of the load cell 15 begins to rise. Then, the control device 16 further operates to lower the head unit 3. At this time, the control device 16 operates to pressurize the head unit 3 until the load value becomes the predetermined value, for example, approximately 100 N. At this time, the position of the head unit 3 in the Z axis direction detected by the position sensor 14 is 0.246 mm.

The control device 16 operates to maintain the height of the head unit 3 (in a pressurization state) for a predetermined period of time, and thereafter, the control device 16 operates to depressurize the head unit 3 by raising the head unit 3. For example, when the load value is reduced down to 10 N, the raising of the head unit 3 is stopped and maintained at the position. In this state, the load value is 10 N, which is the predetermined value, and the solder bumps 5a and the metal pads 9a are in contact with each other. At this time, the position of the head unit 3 in the Z axis direction detected by the position sensor 14 is 0.265 mm. Consequently, the change of the heights of the head unit 3 in the Z axis direction due to the depressurization is 0.019 mm (19 μm). The changed amount of 19 μm corresponds to a compression deformation amount of the head unit 3 and the stage 2 when the pressure of the specific value is applied to the head unit 3.

Figure 8:
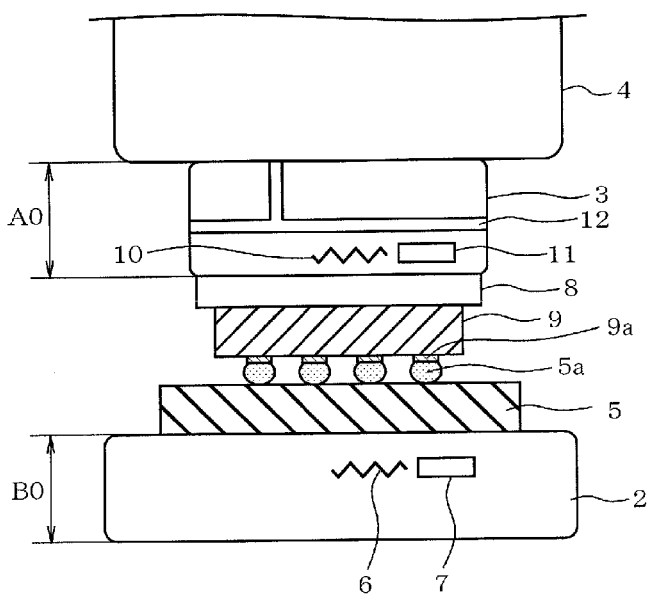
FIG. 8 is an enlarged cross-sectional view of the manufacturing apparatus during a step after the step in FIG. 7.

As described above, by carrying out the depressurization of the head unit 3 (S6), the compression deformation corresponding to the displacement amount of 19 μm, which is generated at the time of the depressurization, may be cancelled. FIG. 8 illustrates the state where the depressurization control has been performed. That is, according to the depressurization of the head unit 3 which is compressed and deformed by the pressurization, the height of the head unit 3 substantially becomes A0, which is the height before the pressurization.

Figure 11:
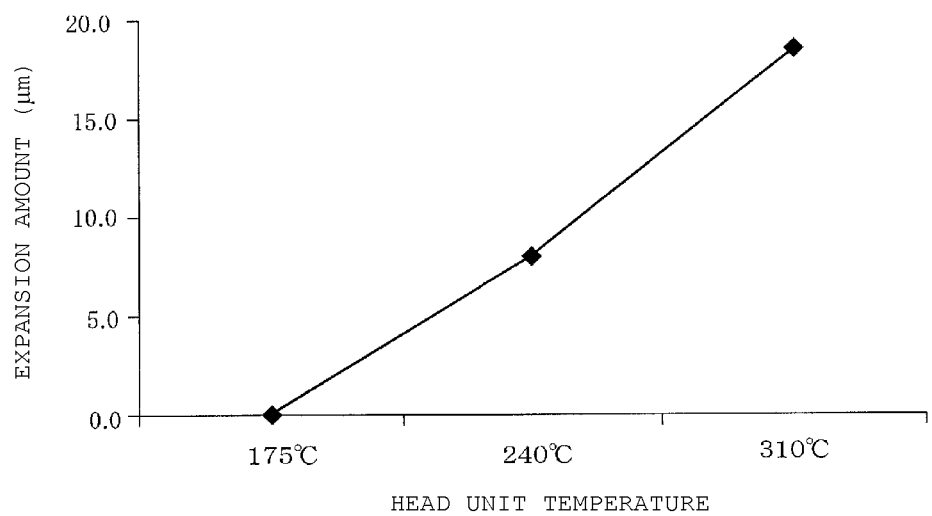
FIG. 11 illustrates an expansion amount of the head unit in accordance with a temperature change.

Next, by the control device 16, the heating control of the head unit 3 is started (S7 in FIG. 2, and time t3 in FIG. 9). When the heating control is carried out, the head unit 3 expands and the height thereof becomes a value larger than A0 due to the thermal expansion, in accordance with the temperature rise. FIG. 11 is a graph indicating the change amount of the height of the head unit 3 in accordance with the temperature rise of the head unit 3.

In FIG. 11, a vertical axis corresponds to the expansion amount of the head unit 3 in the Z axis direction, and a horizontal axis corresponds to the temperature of the head unit 3. Here, the expansion amount of the head unit 3 in the Z axis direction is set to be "0" as a reference when the temperature of the head unit 3 is 175° C. In FIG. 11, the expansion amount is 8.0 μm when the temperature of the head unit 3 is 240° C., and the expansion amount is 18.6 μm when the temperature of the head unit 3 is 310° C. In other words, the expansion amount of the head unit 3 in the Z axis direction increases as the temperature of the head unit 3 increases.

Here, if the Z axis position of the head unit 3 is not mechanically adjusted in consideration of the thermal expansion of the head unit 3, in accordance with heating the head unit 3, the metal pad 9a of the semiconductor element 9 may approach the stage by a distance that is the same as the expansion amount of the head unit 3, and the solder bumps 9a may be crushed.

On the other hand, by the same reason, when the head unit 3 is cooled off by stopping the heating control of the head unit 3, since the head unit 3 contracts by the amount same as the expansion amount. At this time, a lower end portion of the head unit 3 moves upward, and as a result a tensile stress is applied to the solder bumps 9a so as to pull the solder bumps 9a, which is solidified by the cooling, as the metal pads 9a move upward.

According to the present embodiment, the position of the head unit 3 is adjusted so as to offset the change amount of the head unit 3 according to the heating and cooling control as described above. First, when the control device 16 starts electrification to the head heater 11 and the heating control of the head unit 3 (time t3 in FIG. 9), the control device 16 controls the position of the head unit 3 upward, by the amount by which the head unit 3 is to expand by heat (S8 in FIG. 2). Here, the transition of the temperature of the head unit 3 may not necessarily correspond to the expansion amount of the head unit 3 in the Z axis direction. Since the thermal expansion amount tends to linearly increase in accordance with elapse of the time, as illustrated in FIG. 9, the position control of the head unit 3 in the Z axis direction is performed in accordance therewith.

As a result, the distance between the metal pads 9a of the semiconductor element 9, which is positioned in the lower end portion of the head unit 3, and the solder bumps 5a of the substrate 5 of the stage 2, is maintained substantially constant. Therefore, it is possible to avoid the adjacent solder bumps 5a from contacting each other, which causes a short circuit.

Next, the control device 16 stops the heating of the head unit 3 by stopping the electrification of the head heater 11, after heating is carried out for a predetermined time period, during which the solder bumps 5a are fully melted and the melted solder bumps 5a have affinity with the metal pads 9a (S9 in FIG. 2, and time t4 in FIG. 9). Moreover, at this time, the control device 16, in order to facilitate cooling off the head unit 3, circulates a cooling air through the cooling hole 12.

Accordingly, the temperature of the head unit 3 is rapidly lowered. Moreover, in accordance with the cooling, the control device 16 controls the position of the head unit 3 so as to be lowered (pushed) by the contraction amount by the cooling (S10 in FIG. 2). In this case, it is possible to perform the lowering control of the head unit 3 substantially at the same time as the start time of the cooling. In addition, it is possible to lower the head unit 3 after the cooling of the head unit 3 starts, or lower the position of the head unit 3 before the cooling of the head unit 3 starts.

As a result, the distance between the metal pads 9a of the semiconductor element 9, which is held at the lower end portion of the head unit 3, and the solder bumps 5a of the substrate 5 placed on the stage 2, is maintained substantially constant. Therefore, when the metal pads 9a are raised, it is possible to suppress the tensile stress from being generated and the solder bump 5a, which is solidified by the cooling, from being pulled by the metal pads 9a.

As described above, as the cooling of the head unit 3 proceeds, the solder bumps 5a are solidified and electrically connected to the metal pad 9a. According to the present embodiment, since the position of the head unit 3 (S6 to S10 in FIG. 2) in the Z axis direction is adjusted as described above, the distance d can be maintained substantially constant. The control device 16 maintains this state for a predetermined period of time (predetermined time after time t5 in FIG. 9).

Finally, according to the control by the control device 16, the suction of the semiconductor element 9 to the bonding tool 8 of the head unit 3, is released, and the head unit 3 is raised, whereby the process of separating (S11 in FIG. 2) the semiconductor element 9 from the head unit 3 is finished. As illustrated in FIG. 3C, on the stage 2, the substrate 5 on which the metal pads 9a of the semiconductor element 9 are connected to the solder bumps 5b and that has the predetermined distance d from the semiconductor element 9 remains. Then, it is possible to remove the connected structured of the semiconductor element 9 and the substrate 5 from the stage 2.

According to the above embodiments, in the process of connecting the metal pads 9a of the semiconductor element 9 to the solder bumps 5a of the substrate 5, the head unit 3 and the stage 2 are compressed and deformed during the pressurization of the head unit 3 (S5), and the solder bumps 5a are heated after the depressurization operation (S6) is carried out. According to this procedure, it is possible to cause the shapes of the head unit 3 and the stage 2 compressed by the pressurization to be the shapes without the pressurization. As a result, when the solder bumps 5a are melted by the heating control of the head unit 3, it is possible to suppress head unit 3 from extending towards the stage 2 according to the release of the compression stress, and prevent the adjacent solder bumps 5a from contacting each other, which may cause a short circuit.

Moreover, during the heating control of the head unit 3, by adjusting the position of the head unit 3 in the Z axis direction so as to offset the expansion amount of the head unit 3 by the heating, it is possible to suppress the short circuit between the adjacent solder bumps 5a.

In addition, during the cooling of the head unit 3, since the position of the head unit 3 in the Z axis direction is adjusted to be lowered so as to offset the contraction amount of the head unit 3 due to the cooling, a break of the connection due to the tensile stress may not be caused between the solder bumps 5a and the metal pads 9a.

(Other Embodiments)

It is possible to apply the embodiments to the following modification example, other than the examples described in the above embodiments.

In the above embodiments, the solder bumps 5a may be replaced with metal bumps or metal balls.

Moreover, even when the solder bumps may be disposed on the semiconductor element 9, instead of the substrate 5. In other words, the metal pads are disposed on any one of the substrate 5 and the semiconductor element 9, and the solder bumps are disposed on the other one.

The forcible cooling, i.e., circulating the cooling air into the cooling hole, may not be carried out.

In the above embodiments, by the control device 16, the pressurization and the depressurization are carried out before the heating control, but it is not limited thereto . For example, when the natural oxide film is not formed on the surface of the bumps, the pressurization and the depressurization may not be performed, and the heating of the bumps may be performed without the pressurization and the depressurization.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
  placing a semiconductor element that has a plurality of electrodes and attached to a head, on a substrate, such that a plurality of metal bumps is pressed between the electrodes and the substrate with a first force, and then with a second force that is smaller than the first force;

in a state where the metal bumps are pressed with the second force, starting to heat the head such that the metal bumps are melted;

moving the head away from the substrate while the metal bumps are heated; and cooling the head such that the heated metal bumps are cooled and solidified, wherein while heating the head and moving the head away from the substrate, a distance between the substrate and the semiconductor element is maintained to be constant.

2. The method according to claim 1, further comprising:
moving the head towards the substrate when the head is being cooled.

3. The method according to claim 2, wherein
while the head are being cooled and the head is moved towards the substrate, a distance between the substrate and the semiconductor element is maintained to be constant.

4. The method according to claim 1, wherein placing the semiconductor element on the substrate includes,
moving the head towards the substrate, such that the metal bumps are pressed with the first force, and
moving the head away from the substrate, such that the metal bumps are pressed with the second force.

5. The method according to claim 1, wherein
during the heating of the head, a temperature of a heating unit is raised to a predetermined value, and
the head is kept being moved away from the substrate after the temperature of the heating unit reaches a predetermined value.

6. The method according to claim 1, wherein
during the heating of the head, a temperature of a heating unit is raised to a predetermined value, and
during the cooling of the head, the heating unit is turned off.

7. The method according to claim 1, wherein
during the cooling of the head, an air is flowed through the metal bumps.

8. A method for manufacturing a semiconductor device, comprising:
placing a semiconductor element that has a plurality of electrodes and attached to a head, on a substrate, such that a plurality of metal bumps is pressed between the electrodes and the substrate with a first force;
after the metal bumps are pressed with the first force, moving the semiconductor element away from the substrate such that the metal bumps are pressed between the electrodes and the substrate with a second force that is smaller than the first force;

in a state where the metal bumps are pressed with the second force, starting to heat the head such that the metal bumps are melted;

moving the head away from the substrate when the head is being heated;

cooling the head such that the heated metal bumps are cooled and solidified; and moving the head towards the substrate when the head is being cooled, wherein while heating the head and cooling the head, a distance between the substrate and the semiconductor element is maintained to be constant.

9. The method according to claim 1, wherein
the head starts to be moved away from the substrate at a timing when the head starts to be heated.

10. A method for manufacturing a semiconductor device, comprising:
placing a semiconductor element that has a plurality of electrodes and attached to a head, on a substrate, such that a plurality of metal bumps is pressed between the electrodes and the substrate with a first force, and then with a second force that is smaller than the first force;

in a state where the metal bumps are pressed with the second force, starting to heat the head such that the metal bumps are melted;

moving the head away from the substrate while the metal bumps are heated;

cooling the head such that the heated metal bumps are cooled and solidified; and moving the head towards the substrate when the head is being cooled wherein the head starts to be moved towards the substrate at a timing when the head starts to be cooled.

11. The method according to claim 2, wherein
the head starts to be moved towards the substrate before the head starts to be cooled.

12. The method according to claim 8, wherein
the head starts to be moved away from the substrate at a timing when the head starts to be heated.

13. The method according to claim 8, wherein
the head starts to be moved towards the substrate at a timing when the head starts to be cooled.

* * * * *